(12) United States Patent
Gunji et al.

(10) Patent No.: US 8,173,971 B2
(45) Date of Patent: *May 8, 2012

(54) SAMPLE TRANSFER UNIT AND SAMPLE TRANSFERRING METHOD

(75) Inventors: Takashi Gunji, Mito (JP); Hidetoshi Sato, Hitachinaka (JP); Katsuya Kawakami, Mito (JP); Hideki Yatabe, Kasama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 168 days.

This patent is subject to a terminal disclaimer.

(21) Appl. No.: 12/788,037

(22) Filed: May 26, 2010

(65) Prior Publication Data

US 2010/0230592 A1    Sep. 16, 2010

Related U.S. Application Data

(63) Continuation of application No. 12/038,179, filed on Feb. 27, 2008, now Pat. No. 7,737,416.

(30) Foreign Application Priority Data

Feb. 28, 2007    (JP) ................................. 2007-049618

(51) Int. Cl.
*G01B 15/00* (2006.01)
*H01L 21/677* (2006.01)

(52) U.S. Cl. ............... 250/441.11; 250/442.11; 250/306; 250/307; 414/217; 414/801; 414/802

(58) Field of Classification Search .................. 250/306, 250/307, 309–311, 440.11, 441.11, 442.11, 250/492.3; 73/863, 863.01; 204/298.21, 204/298.25; 414/217, 217.1, 222.01, 785, 414/801, 802, 805

See application file for complete search history.

(56) References Cited

U.S. PATENT DOCUMENTS

| | | |
|---|---|---|
| 6,220,808 B1 | 4/2001 | Bonora et al. |
| 7,581,916 B2 | 9/2009 | Miller |

(Continued)

FOREIGN PATENT DOCUMENTS

WO    WO 02/21583 A1    3/2002

OTHER PUBLICATIONS

Japanese Office Action dated Sep. 20, 2011 (three (3) pages).

(Continued)

*Primary Examiner* — Bernard E Souw
(74) *Attorney, Agent, or Firm* — Crowell & Moring LLP

(57) ABSTRACT

There is provided a mini environment type transfer unit which can efficiently transfer a sample to a critical dimension scanning electron microscope (CD-SEM) even in the case of use of a SMIF pod which can store only one photomask. In addition to a load port, a stocker which can store a plurality of photomasks is provided in the mini environment type transfer unit. A mask storage slot in which a plurality of storage units are stacked is provided in the stocker, and one photomask is stored in each storage unit. A sensor is provided in each storage unit to determine whether or not the photomask is normally stored. Additionally, a sensor is provided in each storage unit to detect whether or not the photomask exists.

16 Claims, 5 Drawing Sheets

U.S. PATENT DOCUMENTS

| | | |
|---|---|---|
| 7,737,416 B2 * | 6/2010 | Gunji et al. ............... 250/442.11 |
| 2004/0017556 A1 | 1/2004 | Nakahara |
| 2005/0121611 A1 | 6/2005 | Kimba et al. |
| 2007/0194235 A1 | 8/2007 | Kimba et al. |
| 2008/0014056 A1 | 1/2008 | Miller |
| 2008/0203302 A1 * | 8/2008 | Gunji et al. .................... 250/311 |
| 2008/0308729 A1 | 12/2008 | Kimba et al. |
| 2009/0212213 A1 | 8/2009 | Nakasuji et al. |

OTHER PUBLICATIONS

SEMI (Semiconductor Equipment and Materials International), "SEMI E63-0600A$^E$: Mechanical Specification for 300 mm Box Opener/ Loader to Tool Standard (BOLTS-M) Interface", American National Standards Institute (ANSI), 1997 (including partial English translation of relevant portion).

* cited by examiner

SAMPLE TRANSFER UNIT AND SAMPLE TRANSFERRING METHOD

CROSS REFERENCE TO RELATED APPLICATION

This application is a continuing application of U.S. application Ser. No. 12/038,179, filed Feb. 27, 2008, which claims priority under 35 U.S.C. §119 to Japanese Patent Application No. 2007-049618, filed Feb. 28, 2007, the entire disclosures of which are herein expressly incorporated by reference.

BACKGROUND OF THE INVENTION

1. Field of the Invention

The present invention relates to a mini environment type sample transfer unit, particularly to a sample transfer unit suitably used for a critical dimension scanning electron microscope (CD-SEM) which measures a pattern on wafer or a photomask in manufacturing and inspection processes of a semiconductor integrated circuit.

2. Description of the Related Art

Conventionally, in semiconductor integrated circuit manufacturing process, a clean room has been used to avoid generation of dust and foreign matters. However, recently a clean environment retaining method called a mini environment type has been used instead of the clean room. In the mini environment type, only a space where cleanliness is required is kept at a locally high cleanliness level.

In the semiconductor integrated circuit manufacturing, mini environment type transfer and storage means are standardized. For example, there are well-known SEMI (Semiconductor Equipment and Materials Institute) standard, SMIF (Standard of Mechanical Interface), and FOUP (Front-Opening Unified Pod).

In a semiconductor integrated circuit manufacturing process, the mini environment type is used in not only a wafer handling process but also a process of handling a photomask which is of an original edition of photolithography. In the photomask, a light shielding pattern is formed on a quartz glass having a plate size of 152×152×6.35 mm called 6025. The photomask wafer has the pattern size four times a pattern size on the wafer. Recently, with the progress of the micro pattern, foreign matters and defects of several hundreds nanometers level are not permitted even in the photomask.

An example of a transfer unit used in critical dimension scanning electron microscope (CD-SEM) for measuring the pattern size on the semiconductor integrated circuit manufacturing photomask will be described. When compared with a silicon wafer, the photomask has a heavy weight per sheet, and frequently the single plate processing is performed to the photomask. Therefore, the photomask is transferred one by one. Usually, a SMIF pod is used to transfer the photomask. The SMIF pod is a mini environment type container to store one photomask and the inside of the SMIF pod is kept at a high cleanliness level.

A load port is used to deal with the SMIF pod. The load port is a mini environment type SMIF pod dealing mechanism. In the mechanism of the load port, the SMIF pod is opened and closed in a clean environment, the photomask is taken out from the SMIF pod, and the photomask is inserted into the SMIF pod. The photomask is taken out from the SMIF pod and transferred to a load lock chamber by a robot provided in the transfer unit. The load lock chamber is evacuated to a vacuum level. When the vacuum level in the load lock chamber reaches a predetermined value, a door between the load lock chamber and a sample stage of the critical dimension scanning electron microscope (CD-SEM) is opened to transfer the photomask from the load lock chamber to the sample stage. The pattern size of the photomask is measured with an electron beam. After the pattern size is measured, the photomask is transferred in the reverse path and stored in the SMIF pod again.

The series of the processes, i.e., the open and close of the SMIF pod, the transfer of the photomask, the evacuation of the load lock chamber, the transfer of the photomask to the sample stage, the pattern size measurement of the photomask, and the transfer of the photomask back to the SMIF pod are controlled by a computer and visually displayed by a display device. The series of the processes is performed in a locally clean environment by the mini environment type.

Usually, only one photomask can be stored in the SMIF pod. Accordingly, the SMIF pod on the load port cannot be changed until the pattern size measurement is ended for one photomask. Usually, an operator manually disposes the SMIF pod on the load port. It is necessary for the operator to change the SMIF pod at predetermined time intervals. In order to enhance the work efficiency, it is necessary for the operator to immediately change the SMIF pod to the next SMIF pod when the photomask is returned to the SMIF pod.

There is also well known a SMIF pod which stores a plurality of photomasks. However, the SMIF pod usually used can store only one photomask. Accordingly, in the case of the use of the SMIF pod which stores a plurality of photomasks, it is necessary to replace the photomasks. It is necessary to perform the photomask replacing work in an environment having at least the substantially same cleanliness as that in the SMIF pod. Accordingly, the working efficiency is lowered in the case of the use of the SMIF pod, which can store a plurality of photomasks.

SUMMARY OF THE INVENTION

An object of the present invention is to provide a mini environment type transfer unit which can efficiently transfer the photomask to the critical dimension scanning electron microscope (CD-SEM) even in the case of the use of the SMIF pod which can store only one photomask.

In a mini environment type transfer unit according to an aspect of the invention, a stocker which can store a plurality of photomasks is provided in addition to a load port. A mask storage slot in which a plurality of storage units are stacked is provided in the stocker, and one photomask is stored in each storage unit.

A sensor is provided in each storage unit to determine whether or not the photomask is normally stored. Additionally, a sensor is provided in each storage unit to detect whether or not the photomask exists.

A cover having a window is provided in the stocker. The inside of the stocker can be monitored through the window. One photomask can be taken out by detaching the cover.

According to the invention, in the mini environment type transfer unit, the photomask can efficiently be transferred to the critical dimension scanning electron microscope (CD-SEM) even in the case of the use of the SMIF pod which can store only one photomask.

DESCRIPTIONS OF REFERENCE NUMERALS

Figure 1A:
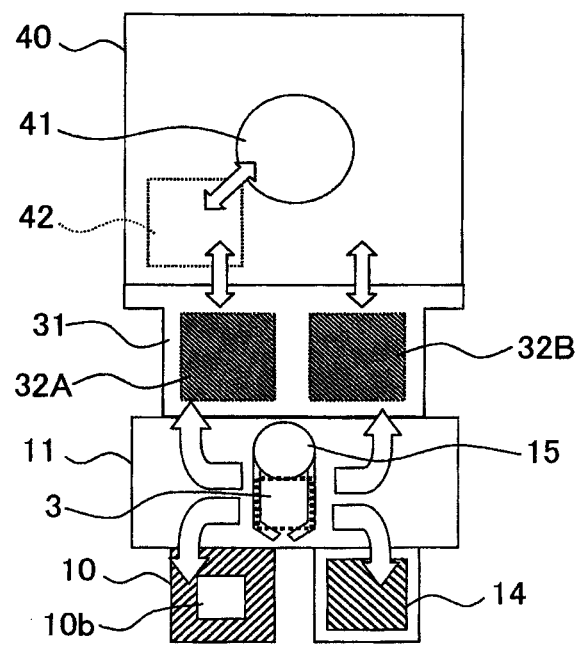
FIGS. 1A, 1B and 1C show a configuration of a critical dimension scanning electron microscope (CD-SEM) according to an embodiment of the invention.

3: Photomask
10: Stocker
10a: Front window
10b: Top window
10c: Side window
11: Sample transfer unit
12: BOLTS surface
13: Load port
14: SMIF pod
15: Sample transfer robot
24: Cover
25: Window frame
26: Screw
28: Screw
31: Load lock chamber
32A, 32B: Mask stage
40: Critical dimension scanning electron microscope (CD-SEM)
41: Electron optical system
42: Sample stage
100: Mask storage slot
100A to 100H: Storage unit
101: Top plate
102: Bottom plate
103: Shaft
111: Base plate
112: Base
113: Column support
114: Mask stage
115A, 115B: Support portion
116A, 117A, and 118A: Light emitting unit
116B, 117B, and 118B: Light receiving unit
120: Screw
121: Base clamp

DESCRIPTION OF THE PREFERRED EMBODIMENTS

Figure 1B:
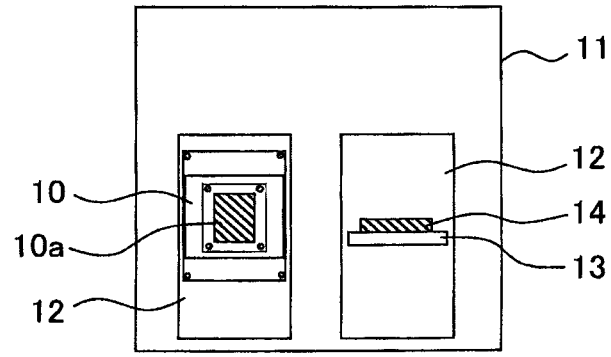
Figure 1C:
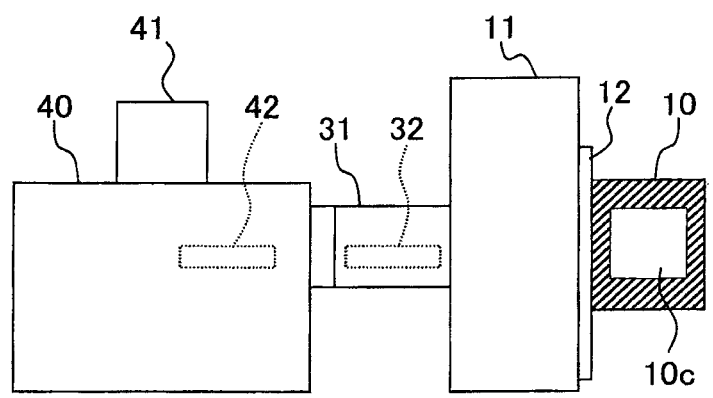

A critical dimension scanning electron microscope (CD-SEM) system according to the present invention will be described below with reference to FIGS. 1A, 1B, and 1C. A critical dimension scanning electron microscope (CD-SEM) which measures a pattern size on a photomask for semiconductor integrated circuit manufacturing is described as the critical dimension scanning electron microscope (CD-SEM) system by way of example. FIG. 1A shows a top configuration of the critical dimension scanning electron microscope (CD-SEM), FIG. 1B shows a front configuration, and FIG. 1C shows a side configuration.

The critical dimension scanning electron microscope (CD-SEM) system includes a mini environment type sample transfer unit 11 and a critical dimension scanning electron microscope (CD-SEM) 40, and a load lock chamber (vacuum evacuation chamber) 31 is provided between the mini environment type sample transfer unit 11 and the critical dimension scanning electron microscope (CD-SEM) 40. As used herein, the mini environment type means a local space or an environment which has predetermined cleanliness. Accordingly, in the mini environment type sample transfer unit 11, a sample is stored and transferred in the local space or the environment having the predetermined cleanliness.

A sample transfer robot 15 is provided in the sample transfer unit 11. BOLTS surfaces 12 are provided in front of the sample transfer unit 11, and a stocker 10 and a load port 13 are provided side by side in the BOLTS surface 12. A mask storage slot (FIGS. 2A and 2B) which stores a plurality of photomasks of measurement target is provided in the stocker 10. The mask storage slot can be configured to be able to store the arbitrary number of photomasks therein. However, in the following description, eight photomasks can be stored in the mask storage slot. A SMIF pod 14 which can store one photomask of measurement target is disposed in the load port 13. Because the load port 13 and the SMIF pod 14 are well known as a mini environment type unit and a container respectively, the detailed description thereof will not be described herein.

Figure 9:
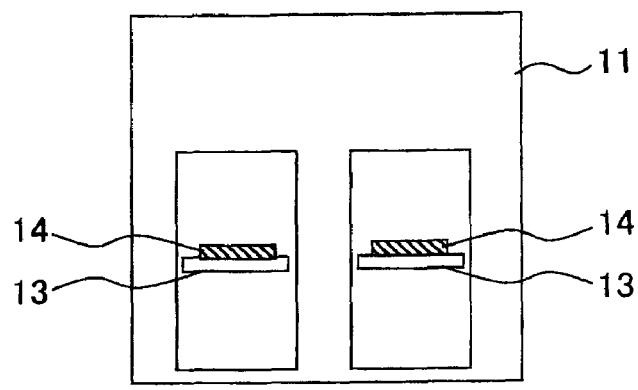
FIG. 9 shows an example of a front configuration of a conventional mini environment type sample transfer unit.

As shown in FIG. 9, two load ports 13 are provided in a conventional mini environment type sample transfer unit. One SMIF pod 14 is disposed in each load port 13. One photomask is stored in each SMIF pod 14.

On the other hand, one load port 13 and one stocker 10 are provided in the embodiment. Accordingly, because a plurality of photomasks can be dealt with at one time in the embodiment, work efficiency is enhanced compared with the conventional sample transfer unit. The sample transfer unit 11 of the embodiment is similar to the conventional sample transfer unit except that the stocker 10 is provided.

Referring to FIGS. 1A, 1B and 1C, a front window 10a, a top window 10b, and a side window 10c are provided in the stocker 10. The state inside the stocker 10 can be monitored through the windows. The stocker 10 is formed by a mini environment type closed container.

In the sample transfer unit 11, a locally high cleanliness level is required in a region where the photomask is disposed or transferred. Therefore, the whole of the sample transfer unit 11 is covered with a box. A fan filter unit (FFU) is provided in a ceiling of the box. Air having a pressure higher than ambient pressure and a high cleanliness level is supplied to the inside of the box through FFU.

The photomask in the SMIF pod 14 on the load port 13 is transferred into the stocker 10 by the sample transfer robot 15 without taking out the photomask to the outside. The sample transfer robot 15 transfers the photomask stored in the stocker 10 into the critical dimension scanning electron microscope (CD-SEM) 40 through the load lock chamber 31, and the size of the photomask is measured in the critical dimension scanning electron microscope (CD-SEM) 40. The photomask in the critical dimension scanning electron microscope (CD- SEM) 40 is returned to the inside of the stocker 10 through the load lock chamber 31. The photomask is not taken out to the outside during the transfer of the photomask. The photomask is transferred in an atmosphere at a high cleanliness level, i.e., in a mini environment type environment.

The load lock chamber (vacuum evacuation chamber) 31 has a hermetic structure, and the load lock chamber 31 can be evacuated to a vacuum atmosphere. The inside of the load lock chamber 31 is divided into a first chamber and a second chamber. Two mask stages 32A and 32B are provided in the first chamber and the second chamber to dispose the photomasks respectively. An electron optical system 41 and a sample stage 42 are provided in the critical dimension scanning electron microscope (CD-SEM) 40.

A computer (not shown), an input device (not shown) such as a mouse and a keyboard, a display device (not shown) having an LCD display, and a storage device (not shown) are connected to the critical dimension scanning electron microscope (CD-SEM) of the embodiment. In the critical dimension scanning electron microscope (CD-SEM) of the embodiment, all the operations including a transfer operation are controlled by the computer. An operator inputs a command and data through the input device. The operator inputs an instruction for the transfer operation using a user interface such as a button displayed on the display device.

The operation of the critical dimension scanning electron microscope (CD-SEM) of the embodiment will be described below. The operator manually disposes the SMIF pod 14 which stores the photomask of measurement target on the load port 13, or the operator disposes the SMIF pod 14 on the load port 13 using an automatic guided vehicle (AGV). One photomask is stored in the SMIF pod 14. The operator specifies one of the stages of the mask storage slot in the stocker 10, i.e., a storage position through the input device. The SMIF pod 14 is opened by the load port 13. The sample transfer robot 15 takes out the photomask from the SMIF pod 14 to dispose the photomask at the position specified in the stocker 10. The operator replaces the empty SMIF pod 14 with a SMIF pod 14 which stores a photomask of measurement target, manually or by the automatic guided vehicle (AGV). Similarly, the photomask in the SMIF pod 14 is transferred to the position specified in the stocker 10. All the photomasks of measurement targets are stored in the stocker 10 by the repetition of the operation. The photomask and the position in the stocker 10, which are specified by the operator, are stored in the storage device and displayed on the display device.

Then, the operator inputs a command for performing the measurement of the photomask through the input device. The sample transfer robot 15 takes out the photomasks from the position specified in the stocker 10, and the sample transfer robot 15 disposes the photomasks on the two mask stage 32A and 32B in the two chambers of the load lock chamber 31 respectively. The load lock chamber 31 is closed to evacuate the two chambers to the vacuum atmosphere. When the two chambers of the load lock chamber 31 reach a specified vacuum level, a door between the first chamber of the load lock chamber 31 and the critical dimension scanning electron microscope (CD-SEM) 40 is opened to transfer the photomask on the first mask stage 32A to the sample stage 42 of the critical dimension scanning electron microscope (CD-SEM) 40. The door between the first chamber of the load lock chamber 31 and the critical dimension scanning electron microscope (CD-SEM) 40 is closed to measure the size of the pattern on the photomask using the electron optical system 41.

After the size is measured, the door between the first chamber of the load lock chamber 31 and the critical dimension scanning electron microscope (CD-SEM) 40 is opened to return the photomask on the sample stage 42 of the critical dimension scanning electron microscope (CD-SEM) 40 to the first mask stage 32A of the load lock chamber 31. Then, the door between the first chamber of the load lock chamber 31 and the critical dimension scanning electron microscope (CD-SEM) 40 is closed.

Then, a door between the second chamber of the load lock chamber 31 and the critical dimension scanning electron microscope (CD-SEM) 40 is opened to transfer the photomask on the second mask stage 32B to the sample stage 42 of the critical dimension scanning electron microscope (CD-SEM) 40. The door between the second chamber of the load lock chamber 31 and the critical dimension scanning electron microscope (CD-SEM) 40 is closed to measure the size of the pattern in the photomask using the electron optical system 41.

On the other hand, the first chamber of the load lock chamber 31 is returned to an atmospheric pressure, and the sample transfer robot 15 returns the photomask whose size has been already measured on the first mask stage 32A to the original position in the stocker 10 after the size is measured. When the size measurement is ended in the critical dimension scanning electron microscope (CD-SEM) 40, the door between the second chamber of the load lock chamber 31 and the critical dimension scanning electron microscope (CD-SEM) 40 is opened to return the photomask whose size has been already measured to the second mask stage 32B. The door between the second chamber of the load lock chamber 31 and the critical dimension scanning electron microscope (CD-SEM) 40 is closed to return the second chamber of the load lock chamber 31 to the atmospheric pressure. The sample transfer robot 15 returns the photomask whose size has been already measured on the second mask stage 32B to the original position in the stocker 10.

According to the critical dimension scanning electron microscope (CD-SEM) of the embodiment, the two mask stages 32A and 32B are provided in the load lock chamber 31, so that the two photomasks can be transferred simultaneously and sequentially. Therefore, the photomask transfer operation can efficiently be performed.

Figure 2A:
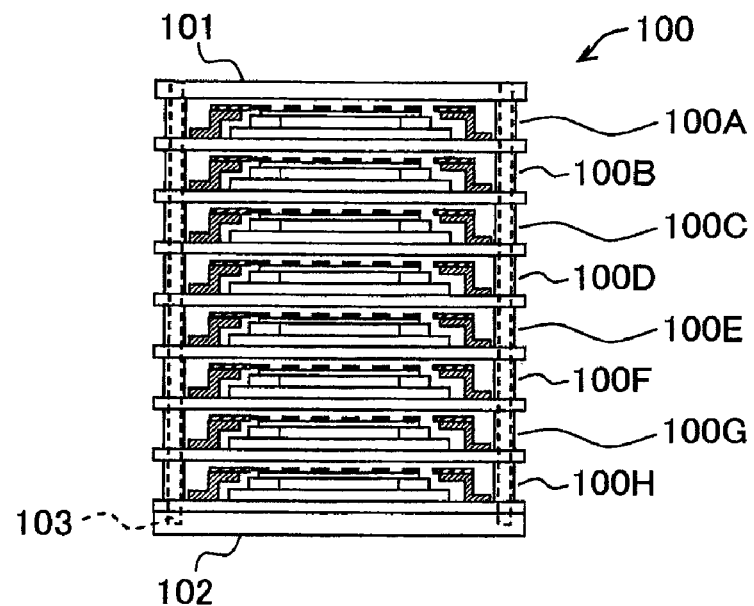
FIGS. 2A and 2B are views explaining an example of a structure of a mask storage slot in a stocker of the critical dimension scanning electron microscope (CD-SEM) of the embodiment.
Figure 2B:
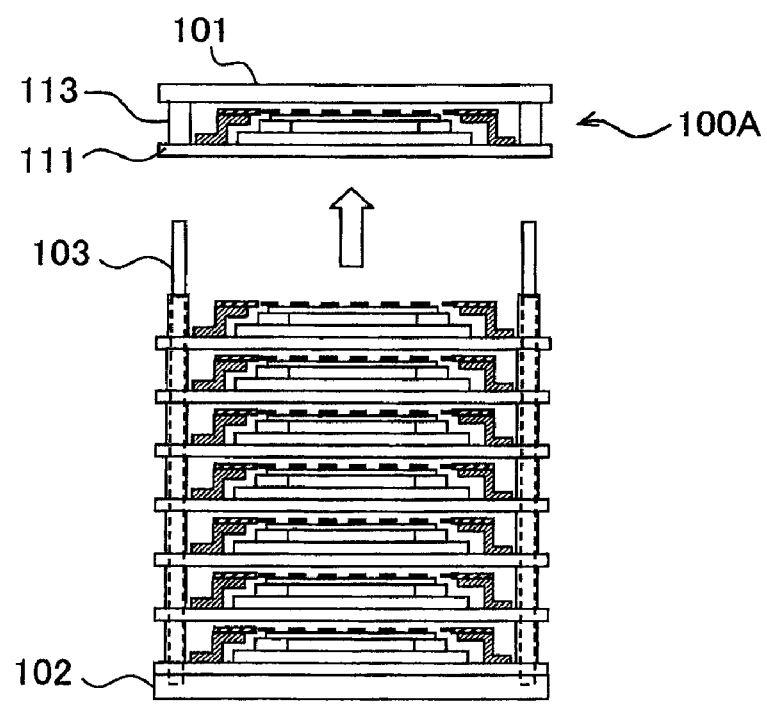

A structure of a mask storage slot 100 provided in the stocker 10 will be described with reference to FIGS. 2A and 2B. As shown in FIG. 2A, the mask storage slot 100 includes a top plate 101 and a bottom plate 102 which are connected by shafts 103. A plurality of storage units 100A to 100H are laminated between the top plate 101 and the bottom plate 102. FIG. 2B shows a state in which the top plate 101 and the topmost storage unit 100A are detached. Each of the storage units 100A to 100H includes a base plate 111 and pipe-like column supports 113, and one photomask is retained in each storage unit. The storage units 100A to 100H are retained by the column supports 113 at predetermined intervals.

A method for assembling the mask storage slot 100 will be described below. The shafts 103 are set up at four corners of the bottom plate 102. The bottom plate 102 and the top plate 101 have square shapes. Bores are formed in four corners of the base plate 111 which stores photomask 3. A diameter of the bore is formed larger than a diameter of the shaft 103 such that the shaft 103 passes through the bore, and the diameter of the bore is formed smaller than an outer diameter of the column support 113 such that the column support 113 does not pass through the bore. The base plate 111 is disposed from above such that the shafts 103 pass through the bores at the four corners of the base plate 111. Then, the column supports 113 are arranged such that the shafts 103 pass through the pipe-like column supports 113 whose diameters are larger than the diameter of the shaft 103. Thus, one stage of the storage unit 100 is assembled. Then, the base plate 111 is disposed from above such that the shafts 103 pass through the bores at the four corners of the base plate 111. The second stage of the base plate 111 is retained by the column supports 113 of the first stage.

Then, the column supports 113 are arranged such that the shafts 103 pass through the column supports 113. Thus, the second stage of the storage unit 100 is assembled. When eight storage units are laminated by the repetition, the top plate 101 is finally disposed. When the storage units are taken apart, the top plate 101 is detached, and the column supports 113 and the base plate 111 are sequentially detached.

Figure 3:
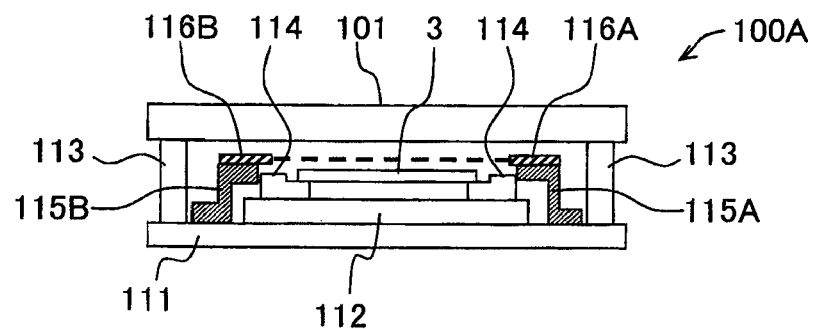
FIG. 3 is a view explaining an example of a structure of a storage unit of the mask storage slot in the stocker of the critical dimension scanning electron microscope (CD-SEM) of the embodiment.

A structure of the storage unit will be described below with reference to FIG. 3. FIG. 3 shows a top-stage storage unit 100A of FIG. 2B. The storage unit 100A includes a base plate 111, a base 112 disposed on the base plate 111, and a mask stage 114 disposed on the base 112. The photomask 3 is disposed on the mask stage 114. One photomask is retained in the storage unit 100A of the embodiment.

A photosensor is provided in the storage unit 100A to detect existence and inclination of the photomask 3. The photosensor will be described. Support portions 115A and 115B are provided in the base plate 111. An inclination detecting light emitting unit 116A is disposed on the support portion 115A, and an inclination detecting light receiving unit 116B is disposed on the support portion 115B.

In the case where the photomask 3 is normally disposed on the mask stage 114, light emitted from the inclination detecting light emitting unit 116A is received by the inclination detecting light receiving unit 116B. As shown in FIG. 3, the light emitted from the inclination detecting light emitting unit 116A passes through the position slightly above the surface of the photomask 3 and reaches the inclination detecting light receiving unit 116B. Accordingly, in the case where the inclination detecting light receiving unit 116B normally receives the light emitted from the inclination detecting light emitting unit 116A, it can be determined that the photomask 3 is normally disposed on the mask stage 114.

Figure 4:
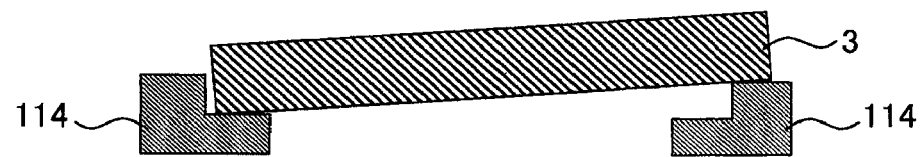
FIG. 4 shows a state in which a photomask is inclined in the stocker of the critical dimension scanning electron microscope (CD-SEM) of the embodiment.

FIG. 4 shows a state in which the inclined photomask 3 is disposed on the mask stage 114. In this case, the light emitted from the inclination detecting light emitting unit 116A is interrupted by the photomask 3 and the light does not reach the inclination detecting light receiving unit 116B, or only part of the light emitted from the inclination detecting light emitting unit 116A reaches the inclination detecting light receiving unit 116B. Accordingly, a judgment whether or not the photomask 3 is normally disposed on the mask stage 114 can be made by monitoring a detection signal from the inclination detecting light receiving unit 116B.

Although not shown, the existence of the photomask 3 can be detected by the photosensor. In this case, an existence detecting light emitting unit and the existence detecting light receiving unit are disposed on both sides of the photomask at the same height as the photomask. In the case where the photomask does not exist, the existence detecting light receiving unit receives the light emitted from the existence detecting light emitting unit. In the case where the photomask exists, the existence detecting light receiving unit does not receive the light emitted from the existence detecting light emitting unit. Accordingly, a judgment whether or not the photomask 3 exists on the mask stage 114 can be made by monitoring a detection signal from the existence detecting light receiving unit.

Figure 5:
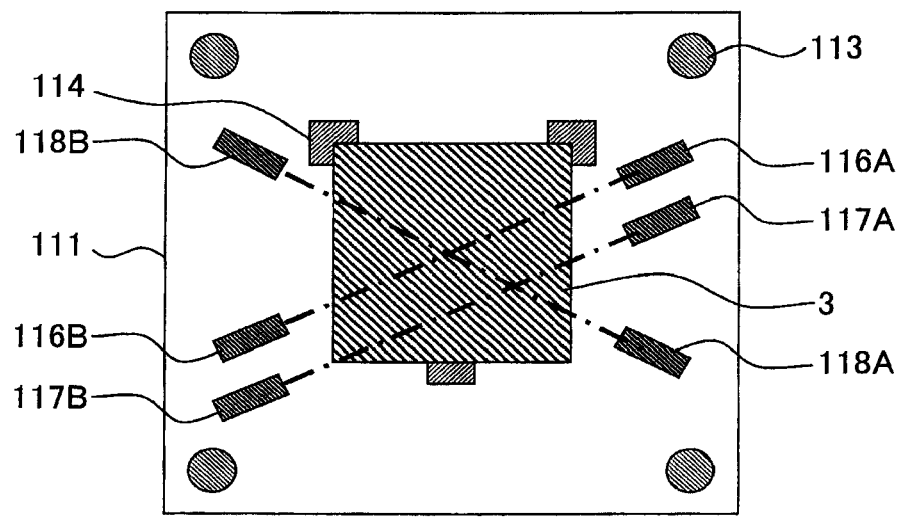
FIG. 5 shows an example of an arrangement of photosensors in the stocker of the critical dimension scanning electron microscope (CD-SEM) of the embodiment.

An arrangement of the photosensors will be described with reference to FIG. 5. A first light emitting unit 116A and a first light receiving unit 116B and a second light emitting unit 118A and a second light receiving unit 118B are provided to detect the inclination of the photomask 3. These units are arranged along two lines intersecting each other. A third light emitting unit 117A and a third light receiving unit 117B are provided to detect the existence of the photomask 3. In FIG. 5, the photomask 3 is supported by three mask stages 114.

According to the invention, the photosensors detect an abnormal position, an abnormal attitude, and an abnormal state of the photomask 3 stored in the stocker 10. Because the photosensors are provided in each storage unit, the abnormal disposition of any photomask can be detected. The computer is notified of the signal from the photosensor. When the signal from the photosensor notifies the computer of the anomaly, the computer generates an error code to stop the operation of the sample transfer robot 15, and the computer displays the generation of anomaly on the display device.

Additionally, the photosensor always monitors the inside of the stocker 10. Therefore, the signals from the photosensor are compared before and after storing the photomask, which allows the abnormal disposition and overlap of the photomask to be detected.

A method for manually taking out one photomask from the stocker 10 will be described with reference to FIGS. 6A and 6B. As described above, in the case where the photomask is normally disposed on the mask storage slot in the stocker 10, it is not necessary to open the stocker 10. The cleanliness level inside the stocker 10 is possibly lowered when the stocker 10 is opened. Therefore, the stocker 10 should be kept closed except in case of necessity. However, if the photomask is not normally disposed on the mask storage slot in the stocker 10, it is necessary to manually remove the photomask.

Figure 6A:
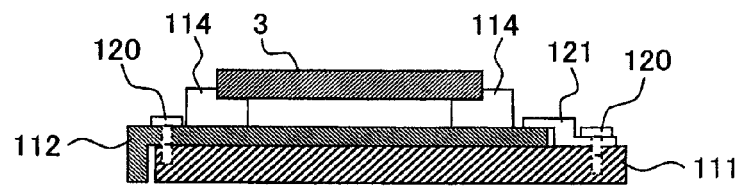
FIGS. 6A and 6B are views explaining a method for taking out one photomask from the stocker of the critical dimension scanning electron microscope (CD-SEM) of the embodiment.
Figure 6B:
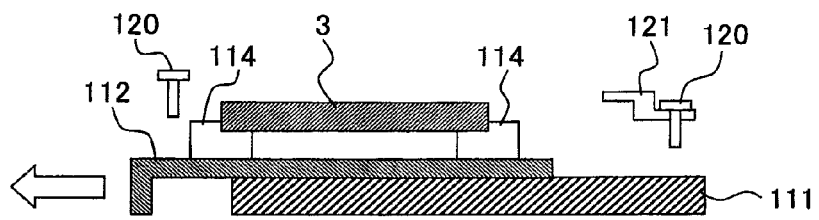

As shown in FIG. 6A, the base 112 is fixed onto the base plate 111 of each storage unit by screws 120 and base clamp 121. Mask stages 114 are fixed onto the base 112. The photomask 3 is retained on the base 112. As shown in FIG. 6B, the two screws 120 are unfastened to remove the base clamp 121, which allows the base 112 retaining the mask stage 114 and photomask 3 to be moved along with the mask stage 114 and photomask 3. Thus, the photomask 3 can be taken out along with the base 112. In the stocker of the embodiment, the desired photomask 3 can be taken out without disassembling the mask storage slot 100 into the storage units.

Thus, in the embodiment, the desired photomask 3 can be taken out, while the stocker 10 is attached to the sample transfer unit 11, namely while the mask storage slot 100 is not detached from the stocker 10.

In the case where the photosensor detects the anomaly of the photomask, only the storage unit in which the anomaly is generated is separated, and the storage unit is repaired or adjusted and exchanged if needed. The work such as the repair, adjustment, and change can be performed by opening the cover having the front window 10a provided in the stocker 10.

Figure 7:
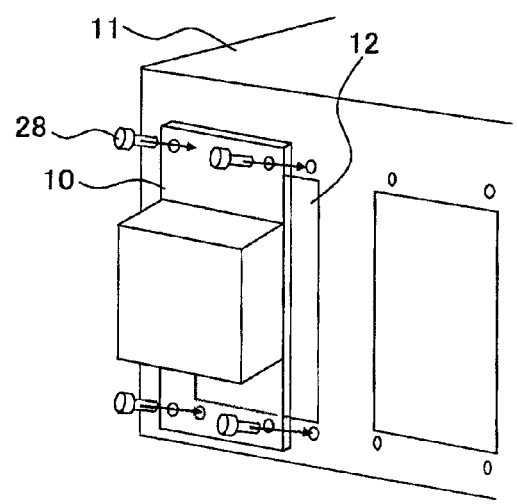
FIG. 7 is a view explaining an example of a stocker attaching structure of the critical dimension scanning electron microscope (CD-SEM) of the embodiment.

FIG. 7 shows a method for attaching the stocker 10 to the BOLTS surface 12 of the sample transfer unit 11. As shown in FIG. 7, the stocker 10 is fixed to the BOLTS surface 12 by screws 28. The stocker 10 can be detached from the sample transfer unit 11 by unfastening the screws 28. According to the invention, as shown in FIGS. 6A and 6B, not only the storage unit in which the anomaly is generated, but also the stocker 10 can be detached while the stocker 10 is attached to the sample transfer unit 11.

Figure 8A:
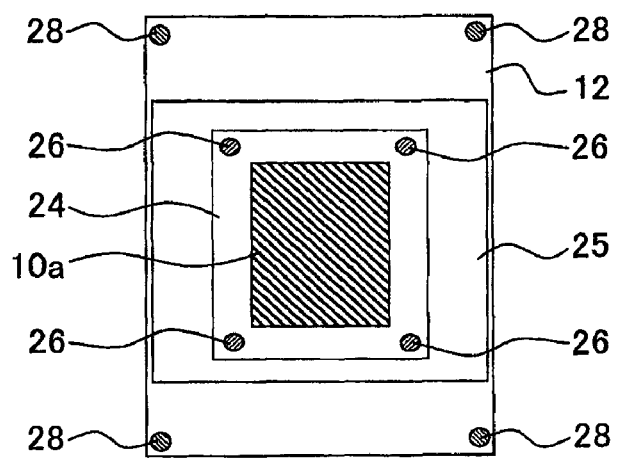
FIGS. 8A and 8B show an example of a structure of a front window provided in the stocker of the critical dimension scanning electron microscope (CD-SEM) of the embodiment.

A structure of the front window 10a provided in the stocker 10 will be described with reference to FIGS. 8A and 8B. As shown in FIG. 8A, the stocker 10 is attached to the BOLTS surface 12 (see FIG. 7) of the sample transfer unit 11 by the screws 28. A window frame 25 is attached to the front face of the stocker 10. A cover 24 having the front window 10a is attached to the window frame 25 by the four screws 26 located at the four corners. The cover 24 can be detached by unfastening the four screws 26.

Figure 8B:
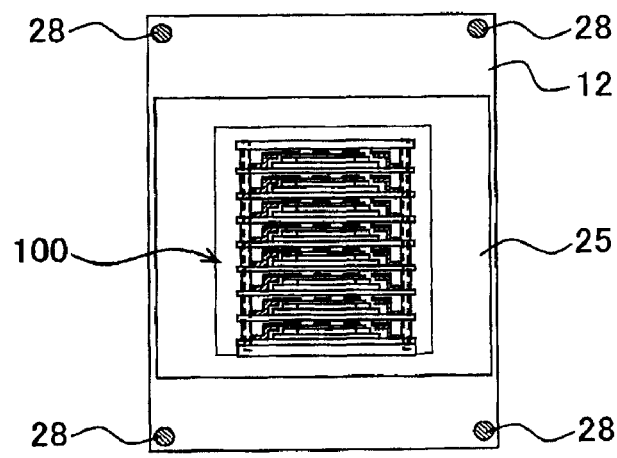

FIG. 8B shows a state in which the cover 24 is detached. The inside of the stocker 10 can be seen when the cover 24 is detached. Thus, one photomask can be taken out from the stocker 10 by detaching the cover 24.

In the case where the photosensor detects the abnormal disposition of the photomask 3, it is necessary to remove the photomask 3. The removing work is performed by a service engineer who has knowledge about the sample transfer unit 11, in particular knowledge about the stocker 10. The work of rewriting the photomask disposition information stored in the storage device and the work of updating the information on the instruction to the sample transfer robot 15 are required when the abnormal photomask is removed from the stocker. Accordingly, sometimes the nonoperating time of at least one day is necessary for the sample transfer unit 11, which results in the problem from the viewpoint of capacity usage rate.

Therefore, the invention includes the following means to shorten the recovery time of the sample transfer unit 11 when the abnormal disposition is generated in the photomask 3.

The first means is to provide the windows in the stocker. The disposition state of the photomask and the existence of the photomask can visibly be confirmed through the windows.

The second means is to be configured so as to be able to detach the cover in which the window is provided. The abnormal photomask can be removed from the stocker by detaching the cover. The cover is attached to the structural portion of the stocker by the screw. An interlock switch is provided in the cover. When the cover is detached, the interlock switch is started up to automatically stop the transfer robot.

The third means is to form the structure in which the desired storage unit can easily be detached from the mask storage slot 100 in the stocker. That is, in the structure, each storage unit can detachably be attached to the mask storage slot 100. Accordingly, only the abnormal photomask can be taken out without disassembling the mask storage slot 100.

The fourth means, as shown in FIG. 7, is to form the structure in which the stocker can be removed from the sample transfer unit 11. Accordingly, the photomask removing work can be performed not only in the state the stocker is attached to the sample transfer unit 11, but also in the state in which the stocker is detached from the sample transfer unit 11.

In the embodiment, the pattern size on the semiconductor integrated circuit manufacturing photomask is measured with the critical dimension scanning electron microscope (CD-SEM) system of the invention. However, in addition to the measurement of the pattern size on the photomask, the critical dimension scanning electron microscope (CD-SEM) system of the invention can be applied to the measurement of the wafer size as well as the measurement of the sample having the similar structure.

In the embodiment, one photomask is stored in the SMIF pod. Alternatively, the critical dimension scanning electron microscope (CD-SEM) system of the invention may be used in the case where the a plurality of photomasks are stored in the SMIF pod.

The present invention is not limited to the above-described embodiments, but those skilled in the art can easily understand that various changes can be made within the scope of the invention described in claims.

What is claimed is:

1. A sample transfer unit comprising:
    a load port for opening and closing a SMIF pod in an environment having predetermined cleanliness;
    a stocker for storing a plurality of samples in an environment having predetermined cleanliness; and
    a transfer robot for transferring a sample between said stocker and said SMIF pod retained by said load port in an environment having predetermined cleanliness
    wherein said stocker has a storage slot including a plurality of stacked storage units, and one sample is stored in each of said storage units;
    wherein said storage slot includes a top plate, a bottom plate, a plurality of shafts which connect said top plate and said bottom plate, and a plurality of column supports through which said shafts are passed respectively so that a plurality of spaces are formed between said top plate and said bottom plate and each of said storage units is disposed in each of the spaces; and
    wherein said stocker is detachably fixed with fixing device.

2. The sample transfer unit according to claim 1, wherein each of said storage units includes a base plate, a base disposed on said base plate, a mask stage disposed on said base, and a sample disposed on said mask stage.

3. The sample transfer unit according to claim 1, wherein said base is attached onto said base plate by a screw, and said base, said mask stage disposed on said base, and the sample disposed on said mask stage can be taken out by unfastening said screw.

4. The sample transfer unit according to claim 1, wherein a cover is provided in said stocker, and the cover can be detached.

5. The sample transfer unit according to claim 4, wherein a desired sample can be removed from said storage slot by detaching said cover.

6. The sample transfer unit according to claim 4, wherein a desired storage unit can be removed from said storage slot by detaching said cover.

7. The sample transfer unit according to claim 1, wherein a window is provided in said stocker, and an inside of said stocker is visible through said window.

8. The sample transfer unit according to claim 1, wherein a photosensor is provided in each of said storage units to detect whether or not a sample is normally disposed.

9. The sample transfer unit according to claim 1, wherein a photosensor is provided in each of said storage units to detect whether or not a sample exists.

10. A scanning electron microscope system comprising:
    a scanning electron microscope which has a function of measuring a pattern size of a sample;
    a load lock chamber which can be evacuated to a vacuum level to tentatively retain a sample to be transferred to the scanning electron microscope or a sample which has been transferred from the scanning electron microscope; and
    a sample transfer unit which includes a load port and a transfer robot, said load port opening and closing a SMIF pod in an environment having predetermined cleanliness, said transfer robot transferring a sample in an environment having predetermined cleanliness;
    wherein a stocker is provided to store a plurality of plate-shaped samples in an environment having a predetermined cleanliness, said transfer robot transfers the sample between said stocker and said SMIF pod retained by said load port, said transfer robot transfers the sample between said stocker and said load lock chamber, said stocker includes a plurality of storage slots containing a plurality of stacked storage units, and one sample is stored in each of said storage units;

wherein said stocker has a storage slot including a plurality of stacked storage units therein, and one sample is stored in each of said storage units;

wherein said storage slot includes a top plate, a bottom plate, a plurality of shafts which connect said top plate and said bottom plate, and a plurality of column supports through which said shafts are passed respectively, so that a plurality of spaces are formed between said top plate and said bottom plate and each of said storage units is disposed in each of the spaces; and wherein said stocker is detachably fixed with fixing device.

11. The scanning electron microscope system according to claim 10, wherein a cover is provided in said stocker, and a desired sample or desired storage unit can be removed from said storage slot by detaching said cover.

12. The scanning electron microscope system according to claim 10, wherein a window is provided in said stocker, and an inside of said stocker is visible through said window.

13. The scanning electron microscope system according to claim 10, wherein a photosensor is provided in each of said storage units, and said photosensor detects whether or not a sample is normally disposed or whether or not a sample exists.

14. A sample transferring method with a sample transfer unit including a load port and a transfer robot, said load port opening and closing a SMIF pod in an environment having predetermined cleanliness, said transfer robot transferring a sample in an environment having predetermined cleanliness, the sample transferring method comprising:

providing a stocker for storing a plurality of samples, said stocker being adjacent to said load port of said sample transfer unit and being detachably fixed with a fixing device;

disposing said SMIF pod which stores a sample on said load port;

opening said SMIF pod by said load port;

transferring a sample from said SMIF pod to said stocker using said transfer robot;

transferring a sample from said stocker to a load lock chamber using said transfer robot;

closing said load lock chamber to evacuate said load lock chamber to a vacuum level;

transferring a sample from said load lock chamber to a sample stage of a scanning electron microscope;

measuring said sample using said scanning electron microscope;

transferring the sample from the sample stage of said scanning electron microscope to said load lock chamber;

opening said load lock chamber to an atmospheric pressure; and transferring the sample from said load lock chamber to said stocker using said transfer robot;

wherein said storage slot includes a top plate, a bottom plate, and a plurality of shafts which connect said top plate and said bottom plate, and a plurality of column supports through which said shafts are passed respectively so that a plurality of spaces are formed between said top plate and said bottom plate and each of said storage units is disposed in each of the spaces.

15. The sample transferring method according to claim 14, comprising: detaching a cover provided in said stocker; and detaching a desired sample from said storage slot.

16. The sample transferring method according to claim 14, comprising detecting whether or not a sample stored in said stocker is normally disposed using a photosensor provided in said storage unit.

* * * * *